United States Patent
Hopper et al.

(10) Patent No.: US 7,005,388 B1
(45) Date of Patent: Feb. 28, 2006

(54) METHOD OF FORMING THROUGH-THE-WAFER METAL INTERCONNECT STRUCTURES

(75) Inventors: Peter J. Hopper, San Jose, CA (US); Vladislav Vashchenko, Palo Alto, CA (US); Peter Johnson, Sunnyvale, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 19 days.

(21) Appl. No.: 10/728,319

(22) Filed: Dec. 4, 2003

(51) Int. Cl.
*H01L 21/302* (2006.01)
*H01L 21/461* (2006.01)

(52) U.S. Cl. ..................... 438/733; 438/745
(58) Field of Classification Search ............... 438/733, 438/692, 700, 706, 734, 736, 738, 739, 740, 438/745

See application file for complete search history.

(56) References Cited

U.S. PATENT DOCUMENTS

| | | | |
|---|---|---|---|
| 3,928,093 A | 12/1975 | van Tangerloo et al. | 148/186 |
| 3,937,579 A | 2/1976 | Schmidt | 356/144 |
| 4,189,820 A | 2/1980 | Slack | 29/425 |
| 4,261,781 A | 4/1981 | Edmonds et al. | 156/254 |
| 4,782,028 A | 11/1988 | Farrier et al. | 437/3 |
| 5,142,756 A | 9/1992 | Ibaraki et al. | 29/25.01 |
| 5,166,097 A | 11/1992 | Tanielian | 437/203 |
| 5,240,882 A | 8/1993 | Satoh et al. | 437/226 |
| 5,250,460 A | 10/1993 | Yamagata et al. | 437/62 |
| 5,362,683 A | 11/1994 | Takenaka et al. | 437/226 |
| 5,426,072 A | 6/1995 | Finnila | 437/208 |
| 5,530,552 A | 6/1996 | Mermagen et al. | 356/401 |
| 5,608,237 A | 3/1997 | Aizawa et al. | 257/132 |
| 5,627,106 A | 5/1997 | Hsu | 438/459 |
| 5,674,787 A * | 10/1997 | Zhao et al. | 438/627 |
| 5,702,976 A | 12/1997 | Schuegraf et al. | 437/67 |
| 5,739,067 A | 4/1998 | DeBusk et al. | 438/618 |
| 5,872,053 A * | 2/1999 | Smith | 438/626 |
| 5,904,529 A * | 5/1999 | Gardner et al. | 438/286 |
| 6,010,951 A | 1/2000 | Pushpala et al. | 438/458 |
| 6,015,726 A | 1/2000 | Yoshida | 438/202 |
| 6,027,964 A * | 2/2000 | Gardner et al. | 438/238 |
| 6,110,825 A | 8/2000 | Mastromatteo et al. | 438/667 |
| 6,187,677 B1 | 2/2001 | Ahn | 438/667 |
| 6,221,769 B1 | 4/2001 | Dhong et al. | 438/667 |
| 6,249,136 B1 | 6/2001 | Maley | 324/765 |
| 6,252,300 B1 | 6/2001 | Hsuan et al. | 257/686 |
| 6,479,341 B1 * | 11/2002 | Lu | 438/239 |
| 6,479,382 B1 | 11/2002 | Naem | 438/658 |
| 6,563,189 B1 * | 5/2003 | Dark et al. | 257/530 |

(Continued)

FOREIGN PATENT DOCUMENTS

JP 64-19729 1/1989

OTHER PUBLICATIONS

U.S. Appl. No. 10/728,132, filed Dec. 4, 2003, Peter J. Hopper et al.

(Continued)

*Primary Examiner*—David Nhu
(74) *Attorney, Agent, or Firm*—Mark C.. Pickering

(57) ABSTRACT

A semiconductor die is formed in a process that forms a hole through the wafer prior to the formation of the contacts and the metal-1 layer of an interconnect structure. The through-the-wafer hole is formed by using a wafer with a <110> crystallographic orientation and a wet etch, such as with ethanol (KOH) or tetramethylammonium hydroxide (TMAH).

10 Claims, 7 Drawing Sheets

U.S. PATENT DOCUMENTS 6,815,797 B1 * 11/2004 Dark et al. .................. 257/530

OTHER PUBLICATIONS

U.S. Appl. No. 10/727,838, filed Dec. 4, 2003, Peter J. Hopper et al.

U. Simu et al., "Limits in Micro Replication of CVD Diamond By Moulding Technique", 1997, [online], [retrieved on Nov. 16, 2003]. Retrieved from the Internet: <URL:http://www.angstrom.uu.se/solidstatephysics/joakim/limits.pdf>. pp. 1-11, (note p. 5, col. 2, lines 15-23).

E. Hui et al., "Carbonized Parylene as a Conformal Sacrificial Layer", [online], [retrieved on Nov. 16, 2003]. Retrieved from the Internet: <URL:http://www.bsac.eecs.berkeley.edu/archive/users/hvi-elliot/pdf/sacpaper.pdf>. pp. 1-5 (unnumbered), (note p. 2, Process Characterization, first paragraph).

U.S. Appl. No. 10/004,977, filed Dec. 3, 2001, Yegnashankaran et al.

G. Stemme, "Fabrication of MEMS", [online], [retrieved on Nov. 16, 2003], Retrieved from the Internet: <URL:http://mmadou.eng.vci.edu/PDF%20Files/Stemme%20Fabrication.pdf>. pp. 1-9 (unnumbered), (note p. 3.).

* cited by examiner

METHOD OF FORMING THROUGH-THE-WAFER METAL INTERCONNECT STRUCTURES

BACKGROUND OF THE INVENTION

1. Field of the Invention

The present invention relates to interconnect structures and, more particularly, to a method of forming a through-the-wafer metal interconnect structure.

2. Description of the Related Art

An integrated circuit or chip that includes through-the-wafer metal interconnect structures can be used, for example, to electrically connect a number of integrated circuits or chips that are vertically stacked on top of each other to form a device with a substantially smaller footprint. In addition, through-the-wafer metal interconnect structures can also improve the pad layout density, and even provide backside integration opportunities.

One method of forming a through-the-wafer metal interconnect structure is to first form a trench in the wafer. Once the trench has been formed, a barrier layer and a copper seed layer are subsequently formed in the trench. After the copper seed layer has been formed, a conductive metal layer is electroplated over the seed layer to fill up the trench.

The conductive metal layer, the seed layer, and the barrier layer are then planarized to remove the barrier layer from the surface of the wafer. The planarization step forms a conductive plug that lies in the trench and extends into the wafer. After the remainder of the integrated circuits have been formed on the wafer, the bottom surface of the wafer is planarized or ground down until the bottom surface of the conductive plug is exposed.

FIG. 1 shows a cross-sectional view that illustrates a prior-art, trench-based, through-the-wafer structure 100 prior to the planarizing or grinding step that exposes the bottom side of the conductive plug. As shown in FIG. 1, structure 100 includes a wafer 110, and a trench 112 that is formed in wafer 110.

In addition, as further shown in FIG. 1, structure 100 includes a barrier layer 114 that is formed on wafer 100 to line trench 112, and a copper seed layer 116 that is formed on barrier layer 114. Further, structure 100 includes a copper plug 118 that is electroplated on seed layer 116 to fill up trench 112.

One drawback to a trench-based, through-the-wafer structure is that it is difficult to form barrier layer 114 and copper seed layer 116 with adequate step coverage when the aspect ratio exceeds approximately 4:1, i.e., the depth of the trench is more than four times the width of the trench.

As further shown in FIG. 1, as the depth of trench 112, and thereby the aspect ratio, increases, the thicknesses of barrier layer 114 and copper seed layer 116 decrease. Thus, the quality of the step coverage over trench 112 decreases as the depth of trench 112 increases.

In addition to two layers of material that get thinner as the depth of trench 112 increases, another draw back of a trench-based through-the-wafer structure is that a number of voids, such as void 120, can be formed when a copper solute is electroplated to form copper plug 118. Preferably, barrier layer 114, copper seed layer 116, and copper plug have a uniform thickness with no voids.

One solution to this drawback is to form a through-the-wafer hole rather than forming a plug in a trench, and then exposing the bottom surface of the plug. For example, a through-the-wafer hole can be formed by first forming and patterning a hard mask over the surface of the wafer. The exposed regions are then dry etched, such as with a plasma etcher, using, for example, the Bosch process, until a hole has been formed completely through the wafer.

After the through-the-wafer holes have been formed, a barrier layer is formed on the wafer in the openings. Following this, a copper seed layer is formed on the barrier layer in the openings. Once the copper seed layer has been formed, a copper metal solute is electroplated to the copper seed layer to form a copper plug.

One drawback with forming through-the-wafer holes using dry etching processes is that it takes a significant amount of time for a dry etching process to form a hole through the wafer. As a result, to maintain production-level fabrication rates, additional dry etching equipment is required which, in turn, substantially increases the cost of the wafers.

Thus, there is a need for a method of forming a through-the-wafer hole which takes less time and requires less expense than conventional dry etching processes.

BRIEF DESCRIPTION OF THE DRAWINGS

FIG. 2A is a plan view of die 200, FIG. 2B is a bottom view of die 200, and FIG. 2C is a cross-sectional view of die 200 taken along line 2C—2C of FIG. 2A.

DETAILED DESCRIPTION OF THE INVENTION

Figure 1:
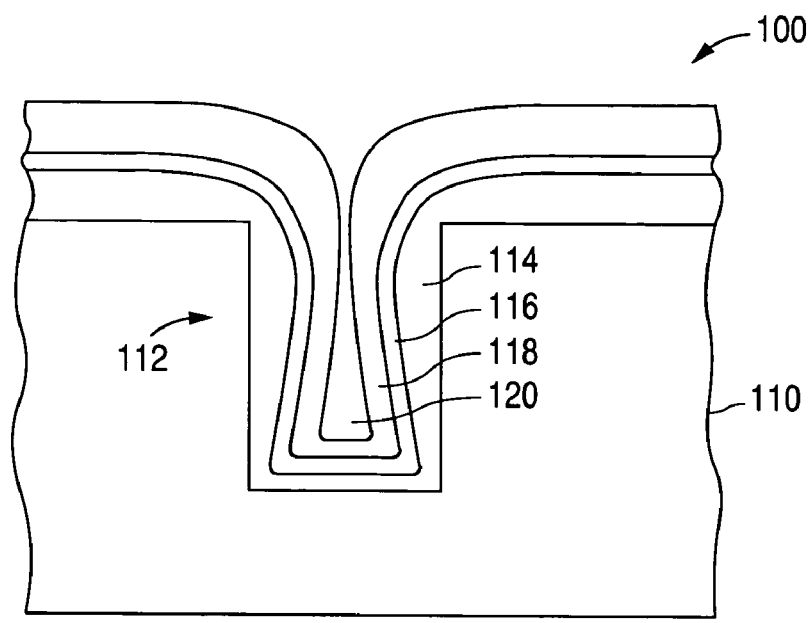
FIG. 1 is a cross-sectional view illustrating a prior-art, trench-based, through-the-wafer structure 100 prior to the planarizing or grinding step that exposes the bottom side of the conductive plug.
Figure 2A:
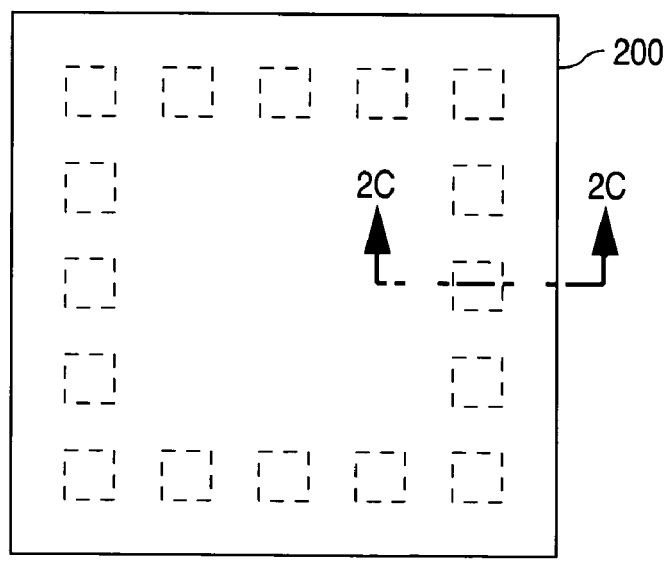
FIGS. 2A–2C are a series of views illustrating a semiconductor die 200 in accordance with the present invention.
Figure 2B:
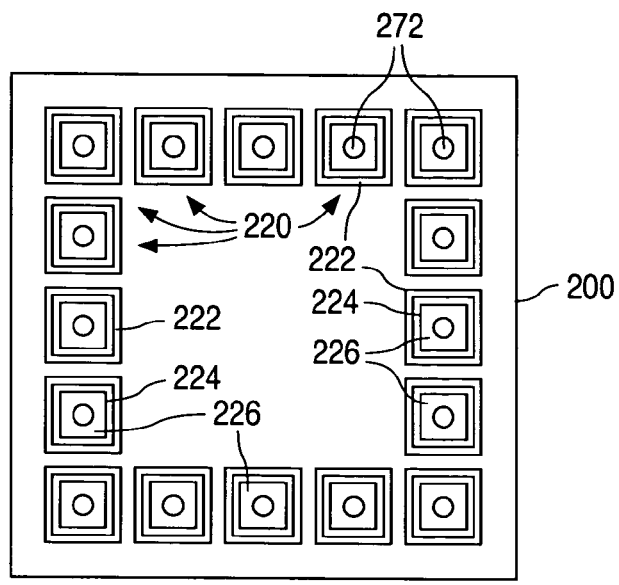
Figure 2C:
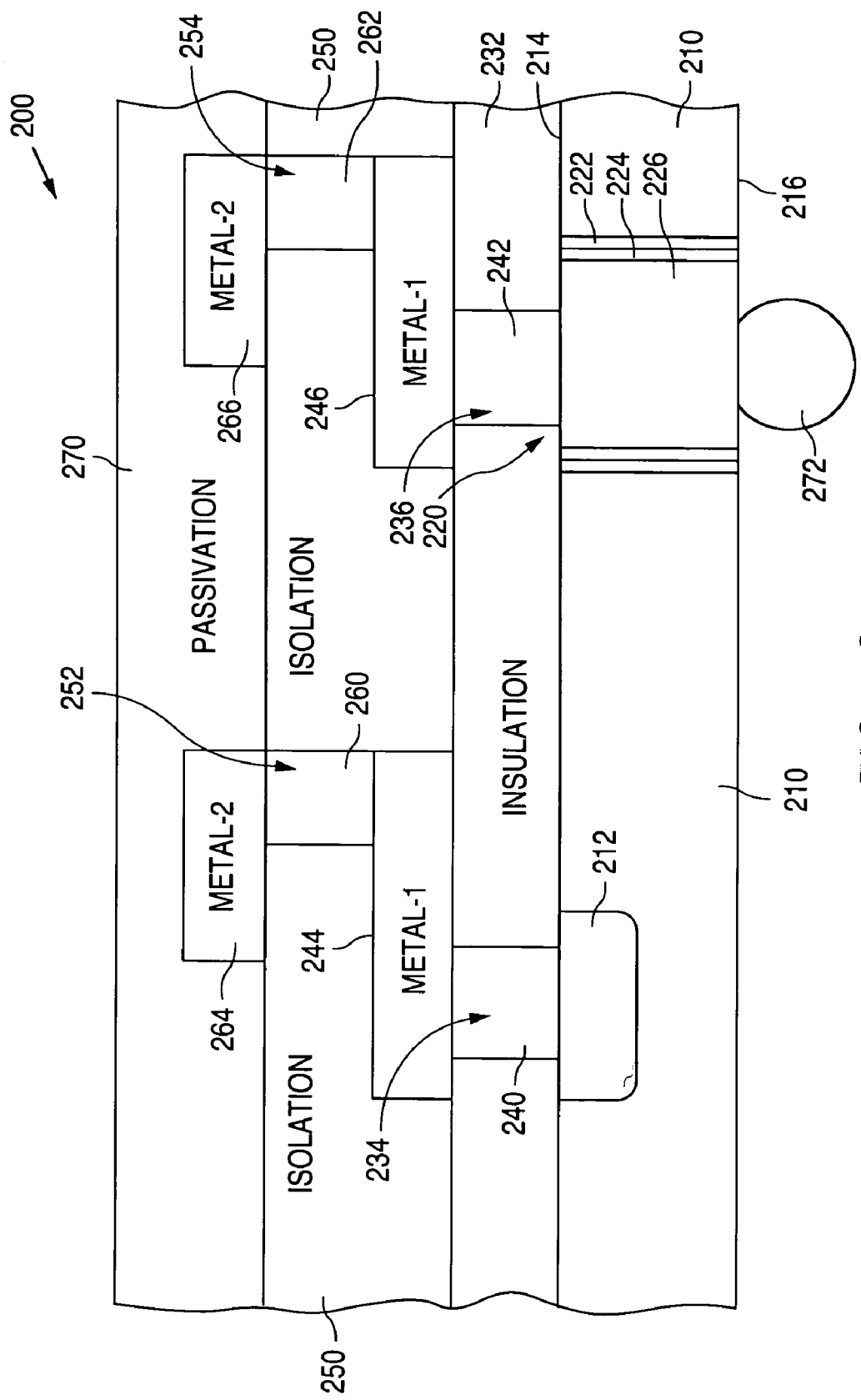

FIGS. 2A–2C show a series of views that illustrate a semiconductor die 200 in accordance with the present invention. FIG. 2A shows a plan view of semiconductor die 200, FIG. 2B shows a bottom view of semiconductor die 200, and FIG. 2C shows a cross-sectional view of semiconductor die 200 that is taken along line 2C—2C of FIG. 2A.

As shown in FIGS. 2A–2C, semiconductor die 200 includes a substrate 210, and a doped region 212 that is formed in substrate 210. Substrate 210 has a top surface 214, an opposing bottom surface 216, and a number of holes 220 that extend from top surface 214 through substrate 210 to bottom surface 216. Each of the holes 220, in turn, has substantially anisotropic side walls. Further, substrate 210 has a <110> crystallographic orientation.

Doped region 212, which is a part of a semiconductor circuit that is formed on substrate 210, can have the same or an opposite conductivity type as substrate 210. When substrate 210 and doped region 212 share the same conductivity type, doped region 212 has a greater dopant concentration than substrate 210.

As further shown in FIGS. 2A–2C, die 200 has a number of barrier layers 222 that are formed on substrate 210 to line the side walls of the holes 220, and a corresponding number of copper seed layers 224 that are formed on the barrier layers 222. In addition, die 200 includes a number of copper plugs 226 that are formed on the copper seed layers 224 to fill up the holes 220.

Die 200 additionally includes an insulation layer 232 that is formed on top surface 214. Insulation layer 232, which can be implemented with, for example, a layer of oxide, has a first opening 234 and a number of second openings, such as second opening 236, that are formed through insulation layer 232. First opening 234 exposes the top surface of doped region 212, while the second openings, such as second opening 236, expose the top surfaces of the plugs 226.

Die 200 further includes a first contact 240 and a number of second contacts, such as second contact 242. First contact 240, which is formed in first opening 234, makes an electrical connection with doped region 212. The second contacts, such as second contact 242, are formed in the second openings, such as second opening 236, to make electrical connections with the plugs 226.

As further shown in FIG. 2C, die 200 includes a first metal-1 trace 244 and a number of second metal-1 traces, such as second metal-1 trace 246. First metal-1 trace 244 is formed on insulation layer 232 and first contact 240 to make an electrical connection with first contact 240. The second metal-1 traces, such as second metal-1 trace 246, are formed on insulation layer 232 and the second contacts to make electrical connections with the second contacts, such as second contact 242. In an alternate embodiment, first metal-1 trace 244 can be connected to one of the second metal-1 traces 246.

In addition, die 200 includes an isolation layer 250 that is formed on insulation layer 232, metal-1 trace 244, and the metal-1 traces, such as metal-1 trace 246. Isolation layer 250, which can be implemented with, for example, a layer of oxide, has a third opening 252 and a number of fourth openings, such as fourth opening 254, that are formed through isolation layer 250. Third opening 252 exposes the top surface of metal-1 trace 244, while the fourth openings, such as fourth opening 254, expose the top surfaces of the second metal-1 traces, such as second metal-1 trace 246.

Die 200 further includes a first via 260 and a number of second vias, such as second via 262. First via 260, which is formed in first opening 252, makes an electrical connection with first metal-1 trace 244. The second vias, such as second via 262, which are formed in the second openings, such as second opening 254, to make electrical connections with the second metal-1 traces, such as second metal-1 trace 246.

As further shown in FIG. 2C, die 200 includes a first metal-2 trace 264 and a number of second metal-2 traces, such as metal-2 trace 266. First metal-2 trace 264 is formed on isolation layer 250 and first via 260 to make an electrical connection with first via 260. The second metal-2 traces, such as metal-2 trace 266, are formed on isolation layer 250 and the second vias to make electrical connections with the second vias, such as second via 262. In an alternate embodiment, first metal-2 trace 264 can be connected to one of the second metal-2 traces 266.

In addition, die 200 further includes a layer of passivation material 270, such as nitride or nitride and an underlying layer of oxide, that is formed on first metal-2 trace 264 and the second metal-2 traces, such as second metal-2 trace 266. Further, die 200 can include a number of solder balls 272 that are formed on the bottom ends of plugs 226.

FIGS. 3A–3L show cross-sectional views that illustrate a method of processing a semiconductor wafer 300 to form a die, such as die 200, in accordance with the present invention. Prior to beginning the method of the present invention, wafer 300, which includes a large number of substrate regions, is conventionally processed to form an identical semiconductor circuit in each substrate region. Each semiconductor circuit, in turn, includes a doped region.

Figure 3A:
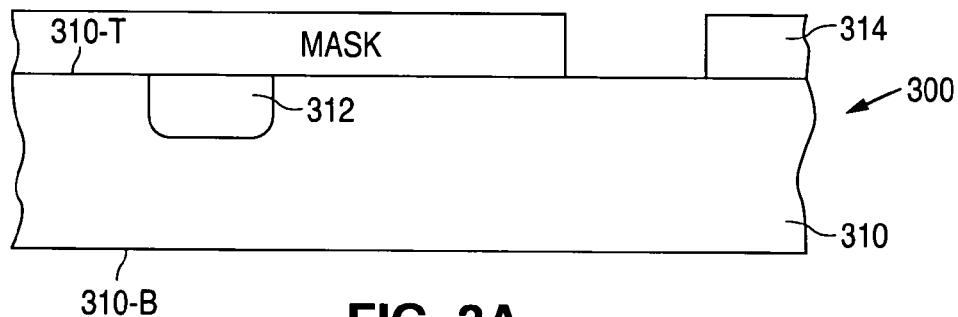
FIGS. 3A–3L are cross-sectional views illustrating a method of processing a semiconductor wafer 300 to form a die, such as die 200, in accordance with the present invention.

FIG. 3A shows a substrate region 310 and a doped region 312 that is formed in substrate region 310. Substrate region 310 has a top surface 310-T, a bottom surface 310-B, and a <110> crystallographic orientation. Doped region 312 can have the same or an opposite conductivity type as substrate region 310. When substrate region 310 and doped region 312 share the same conductivity type, doped region 312 has a greater dopant concentration than substrate region 310.

Referring to FIG. 3A, the method of the present invention begins by forming a layer of masking material 314, such as nitride, over substrate region 310. Once formed, material 314 is then patterned to expose a number of regions on the top surface 310-T of substrate region 310 where the through-the-wafer holes are to be formed. The regions are vertically aligned with where the package bonding pads would normally be formed, such as around the periphery of the package.

Figure 3B:
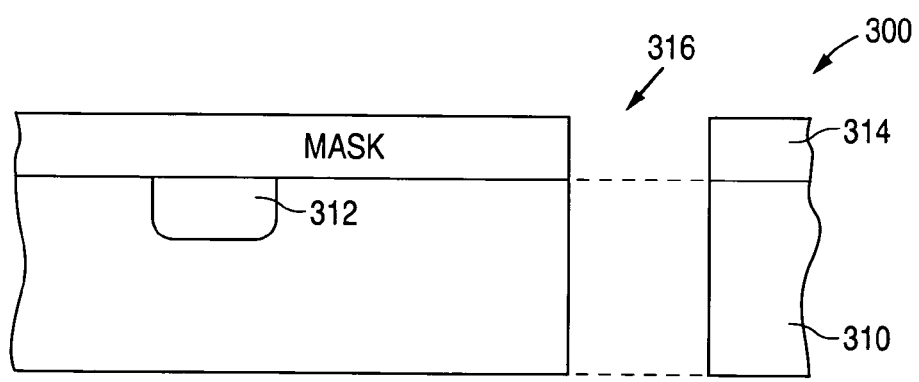

Referring to FIG. 3B, once masking material 314 has been patterned, the exposed areas of substrate region 310 are etched with a wet etchant, such as KOH (ethanol) or TMAH (tetramethylammonium hydroxide), to form a number of holes, such as hole 316, that extend through wafer 300. A KOH etch is a relatively slow etch (e.g., 60 microns/hour), but when used to etch a <110> region of silicon, produces a very deep hole, e.g., greater than 25 micrometers (>25 $\mu$M), with substantially anisotropic side walls.

Due to the time required to complete an etch, a production process would etch a number of wafers at the same time. One of the advantages of the present invention is that it is relatively inexpensive, when compared to dry etching processes, to wet etch a number of wafers at the same time. Following the etch, mask 314 is removed.

Figure 3C:
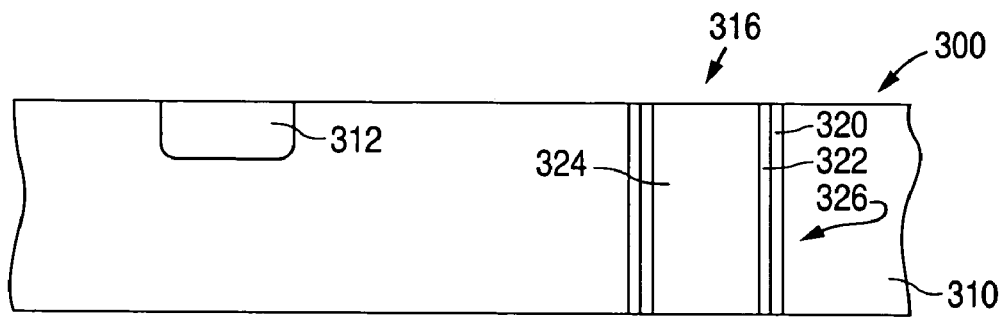

Next, as shown in FIG. 3C, a barrier layer 320 is formed on the surface of substrate 310 to line the side walls of each of the holes, such as hole 316. Following this, a copper seed layer 322 is formed on barrier layer 320. Copper seed layer 322 can be formed by, for example, sputtering.

When the thickness of wafer 300 is the same as the thickness of a wafer with a trench, barrier layer 320 and copper seed layer 322 can be formed with substantially better step coverage because both ends of each hole, such as hole 316, are open. Alternately, a first wafer with a trench and a second wafer with a through-the-wafer hole and a thickness that is roughly twice that of the first wafer with the trench can have approximately the same coverage.

Once copper seed layer 322 has been formed, a conductive metal region 324 is electroplated over copper seed layer 322 to fill up the holes, such as hole 316. One of the advantages of using a through-the-wafer hole is that it is easier to circulate a copper plating solute through the holes. As a result, an improved level of copper ion depletion can be realized with a through-the-wafer hole.

After conductive metal region 324 has been formed, conductive metal region 324, copper seed layer 322, and barrier layer 320 are then planarized to remove barrier layer 320 from the top and bottom surfaces of substrate region 310 to form a number of conductive plugs, such as plug 326, that extends through wafer 300.

Figure 3D:
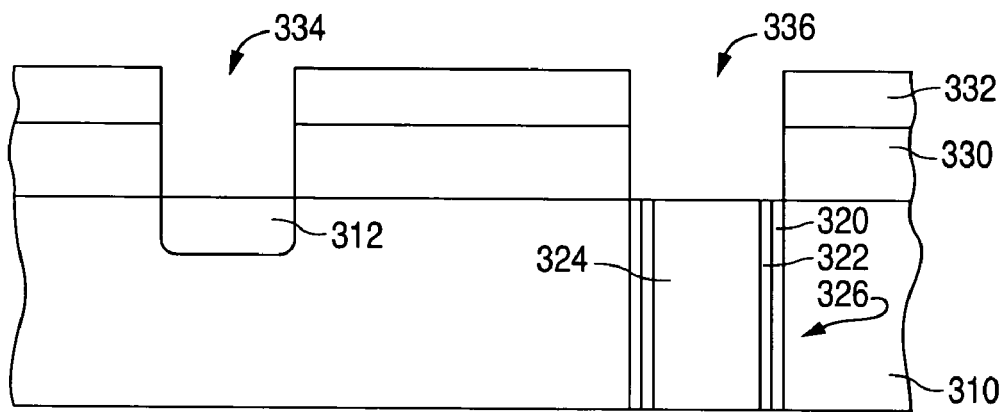

Referring to FIG. 3D, after the plugs, such as plug 326, have been formed, a layer of insulation material 330 is formed over substrate region 310, including doped region 312 and the plugs, such as plug 326. Following the formation of insulation layer 330, a layer of masking material 332 is formed and patterned on insulation layer 330.

Once masking material 332 has been patterned, the exposed regions of insulation material 330 are etched until insulation material 330 has been removed from the surfaces of doped region 312 and the plugs, such as plug 326. The etch forms a contact opening 334 in insulation layer 330 that exposes doped region 312, and a number of hole openings, such as hole opening 336, that exposes the plugs, such as plug 326. Following the etch, masking material 332 is removed.

After the openings, such as contact opening 334 and the hole openings, such as hole opening 336, have been formed, a layer of metal silicide can optionally be formed to reduce the contact resistance. For example, the layer of metal silicide can be implemented with platinum silicide, cobalt silicide, or titanium silicide.

Figure 3E:
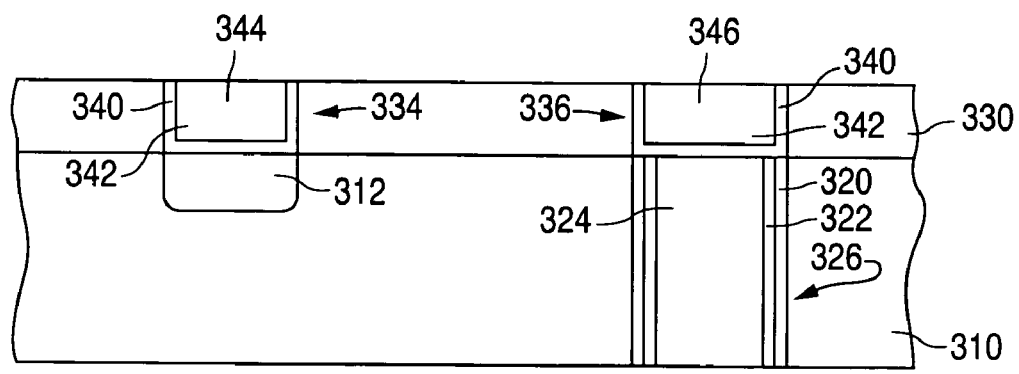

Next, as shown in FIG. 3E, after the openings and any optional metal silicide layers have been formed, a layer of diffusion barrier material 340 is formed on insulation layer 330, doped region 312 (or the metal silicide layers if used), and plug 326 to line contact opening 334 and the hole openings, such as hole opening 336. Diffusion barrier material 340 can be implemented with, for example, titanium, titanium-tungsten, titanium nitride, and tungsten. Following this, a layer of electrically-conductive contact material 342, such as aluminum, is formed on layer 340.

Once contact material 342 has been formed, contact material 342 and then diffusion barrier material 340 are planarized to remove material 340 from the top surface of insulation layer 330. Materials 340 and 342 can be planarized using, for example, chemical-mechanical polishing (CMP) and etch back techniques. The etch forms a conductive contact 344 that makes an electrical connection with doped region 312. The etch also forms a number of conductive contacts, such as conductive contact 346, that make electrical connections with the plugs, such as plug 326.

Figure 3F:
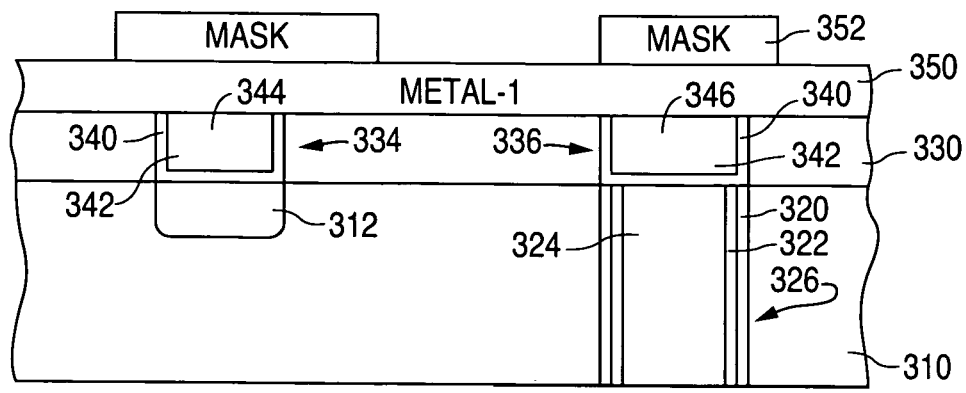

Referring to FIG. 3F, following the etch, a first layer of metal (metal-1) 350 is formed on insulation layer 330, contact 344, and the number of contacts, such as contact 346. After metal-1 layer 350 has been deposited, a first metal trace mask 352 is formed and patterned on metal-1 layer 344.

Figure 3G:
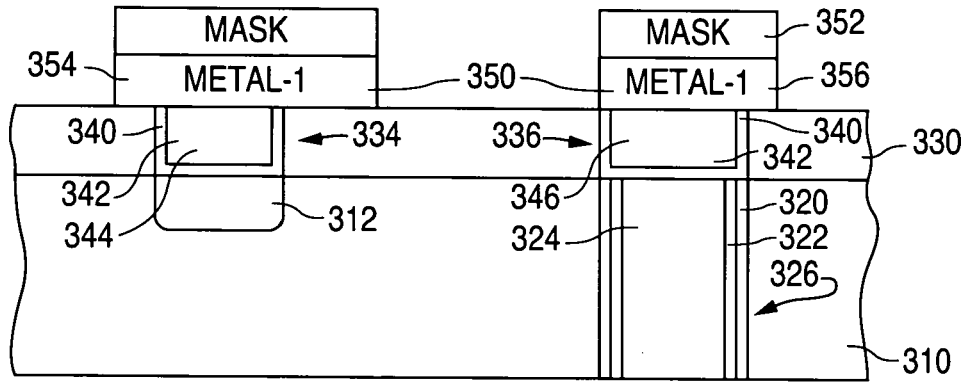

Referring to FIG. 3G, following the patterning of mask 352, the exposed portion of metal-1 layer 350 is etched until metal-1 layer 350 is removed from the surface of the underlying insulation layer 330. Mask 352 is then removed. The etch defines a first metal-1 trace 354 and a number of second metal traces, such as second metal-1 trace 356, and exposes regions of insulation layer 330.

Figure 3H:
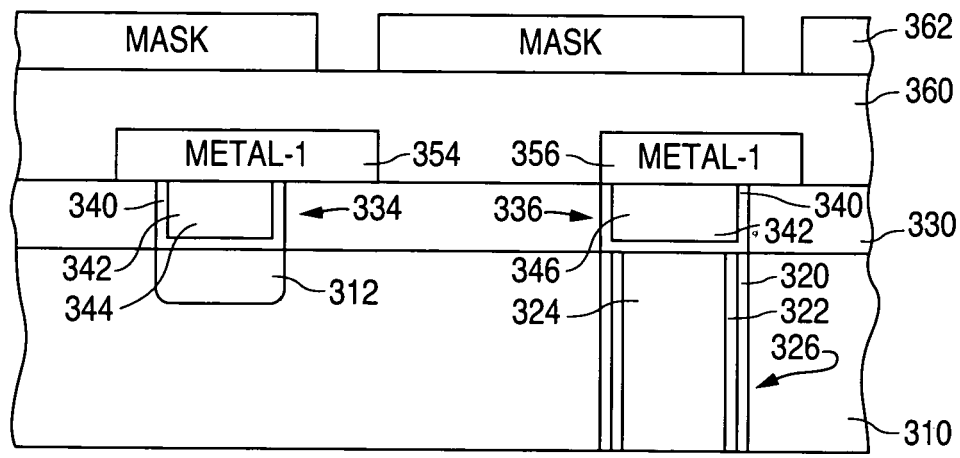

Referring to FIG. 3H, after first metal trace mask 352 has been removed, a layer of isolation material 360 is deposited on the surfaces of metal-1 traces 354 and 356 and the exposed regions of insulation layer 330. Following this, a via mask 362 is formed and patterned on isolation layer 360.

Figure 3I:
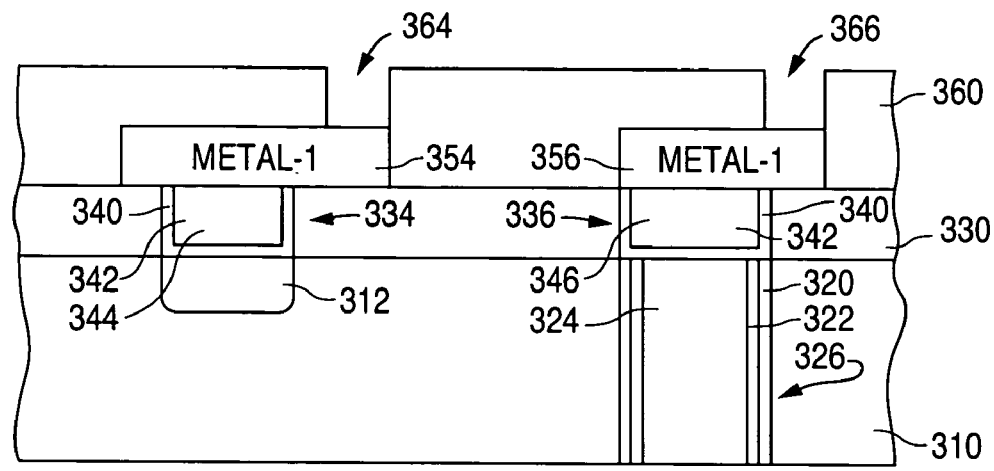
Figure 3J:
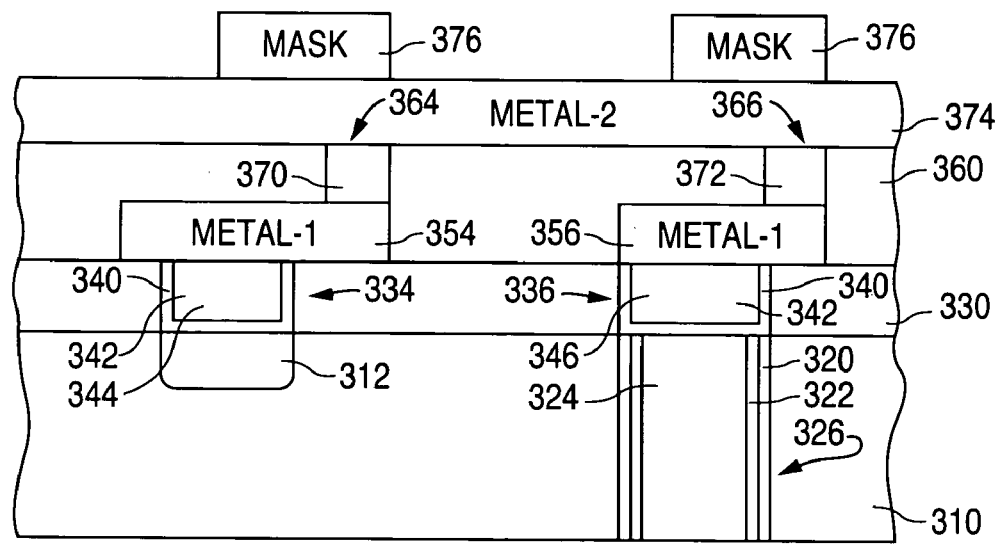

Referring to FIG. 3I, following the patterning of via mask 362, the exposed portions of isolation layer 360 are etched to remove isolation layer 360 from metal trace 354 to form a via opening 364 and a number of via openings, such as via opening 366. After this, via mask 362 is removed. Referring to FIG. 3J, once via mask 354 has been removed, a layer of via metal, such as titanium, is deposited on isolation layer 360 to fill up via openings 364 and 366.

After the via metal layer has been deposited, the via metal layer is etched to remove the via metal layer from the top surface of isolation layer 360. The etch forms a via 370 that contacts metal-1 trace 354, and a number of vias, such as via 363, that contact the second metal-1 traces, such as metal-1 trace 356. Next, a second layer of metal (metal-2) 374 such as, for example, aluminum, is deposited on isolation layer 360, via 370, and via 372 to make an electrical connection with vias 370 and 372. Following this, a second metal trace mask 376 is formed and patterned on metal-2 layer 374.

Figure 3K:
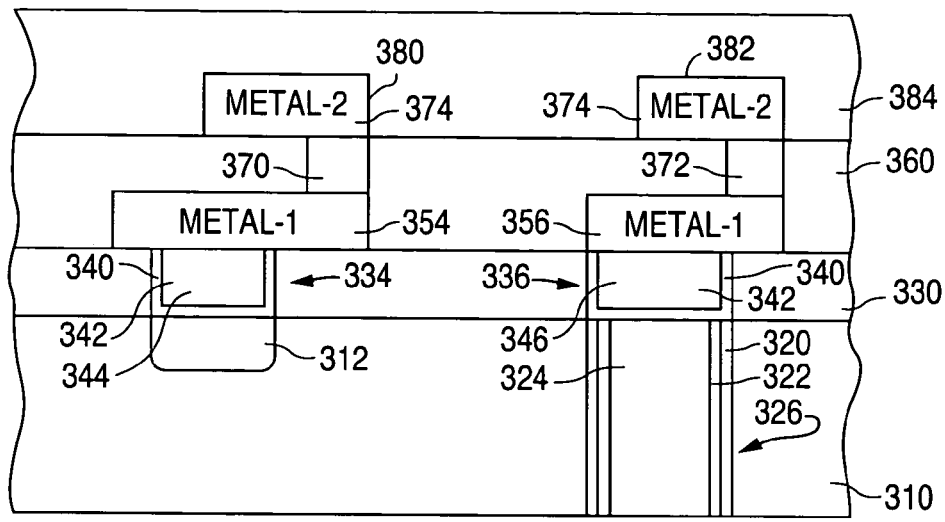

Referring to FIG. 3K, after mask 376 has been patterned, the exposed portions of metal-2 layer 374 are etched until metal-2 layer 374 is removed from the surface of the underlying isolation layer 360. Following the etch, mask 376 is removed. The etch defines a first metal-2 trace 380 and a number of second metal-2 traces, such as second metal-2 trace 382, and exposes regions of isolation layer 360.

After second metal trace mask 376 has been removed, a layer of passivation material 384, such as oxide and an overlying layer of nitride, is deposited on the surfaces of metal traces 380 and 382 and the exposed regions of isolation layer 360. Passivation layer 384 can be formed using conventional plasma-enhanced, chemical-vapor-deposition (PECVD) techniques.

Figure 3L:
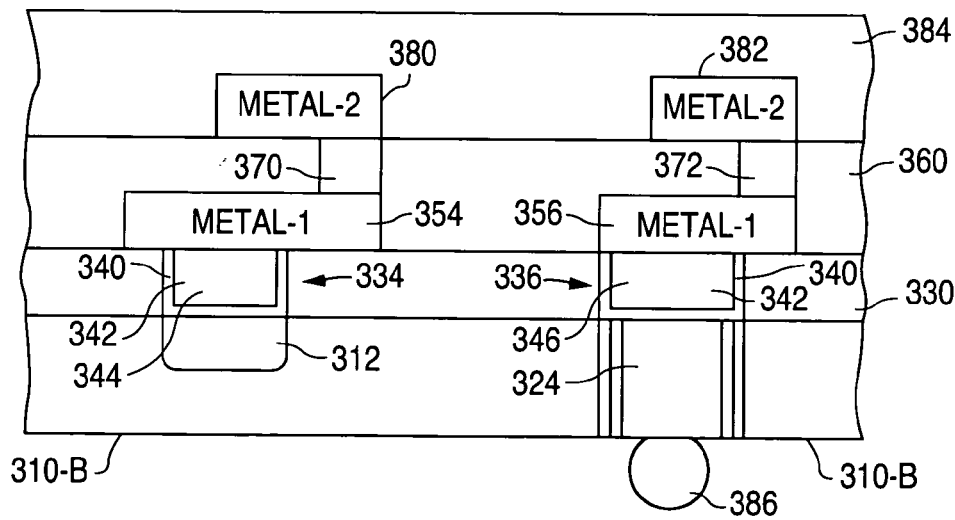

Next, as shown in FIG. 3L, bottom side 310-B of substrate region 310/wafer 300 is cleaned. Following this, a connection material, such as solder balls 386, are then formed to contact the bottom ends of the plugs, such as plug 326. Although not shown, portions of the metal-2 traces can be exposed and utilized as bonding pads, thereby allowing the dice from wafer 300 to be stacked.

It should be understood that the above descriptions are examples of the present invention, and that various alternatives of the invention described herein may be employed in practicing the invention. For example, doped region 312 and the circuitry formed on substrate region 310 can be formed after the plugs, such as plug 326, have been formed. Thus, it is intended that the following claims define the scope of the invention and that structures and methods within the scope of these claims and their equivalents be covered thereby.

What is claimed is:

1. A method of processing a semiconductor material having a top surface and a bottom surface, the method comprising:
    forming a doped region in the top surface of the semiconductor material;
    forming a hole in the semiconductor material that extends through the semiconductor material by:
        forming a layer of masking material over the top surface of the semiconductor material;
        patterning the layer of masking material to expose a region of the top surface of the semiconductor material; and
        wet etching the region of the semiconductor material with an etchant to form the hole, the hole having substantially anisotropic side walls; and
    forming a metallic plug in the hole.

2. The method of claim 1 wherein the etchant includes ethanol (KOH).

3. The method of claim 1 wherein the etchant includes tetramethylammonium hydroxide (TMAH).

4. The method of claim 1 and further comprising:
    forming a first layer of material on the semiconductor material to line the hole; and
    forming a second layer of material on the first layer, the second layer being different from the first layer.

5. The method of claim 4 wherein the first layer of material is a barrier layer, and the second layer of material is a copper seed layer.

6. The method of claim 4 and further comprising forming a metallic material on the second layer of material to fill up the hole.

7. The method of claim 6 and further comprising removing the first layer of material from the top and bottom surfaces of the semiconductor material to form a conductive plug in the hole.

8. The method of claim 7 and further comprising:
   forming a layer of insulation material on the top surface of the semiconductor material, the layer of insulation material having a top surface; and
   forming a first opening and a second opening in the layer of insulation material, the first opening exposing the doped region, the second opening exposing the conductive plug.

9. The method of claim 8 and further comprising:
   forming a first contact structure in the first opening to make an electrical connection with the doped region; and
   forming a second contact structure in the second opening to make an electrical connection with the conductive plug.

10. The method of claim 9 and further comprising forming a layer of metal (metal-1) on the layer of insulation material, the first contact, and the second contact.

* * * * *